(12) United States Patent
Huang et al.

(10) Patent No.: US 11,195,948 B2
(45) Date of Patent: Dec. 7, 2021

(54) HIGH VOLTAGE SEMICONDUCTOR DEVICE AND MANUFACTURING METHOD THEREOF

(71) Applicant: UNITED MICROELECTRONICS CORP., Hsin-Chu (TW)

(72) Inventors: Ya-Hsin Huang, Tainan (TW); Chen-An Kuo, Taoyuan (TW); Po-Chun Lai, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/896,233

(22) Filed: Jun. 9, 2020

(65) Prior Publication Data
US 2021/0351294 A1    Nov. 11, 2021

(30) Foreign Application Priority Data
May 8, 2020    (TW) .................... 109115303

(51) Int. Cl.
| | |
|---|---|
| H01L 29/76 | (2006.01) |
| H01L 29/94 | (2006.01) |
| H01L 31/113 | (2006.01) |
| H01L 29/78 | (2006.01) |
| H01L 29/10 | (2006.01) |
| H01L 21/762 | (2006.01) |
| H01L 29/06 | (2006.01) |
| H01L 29/66 | (2006.01) |
| H01L 29/08 | (2006.01) |

(52) U.S. Cl.
CPC .... *H01L 29/7816* (2013.01); *H01L 21/76224* (2013.01); *H01L 29/0649* (2013.01); *H01L 29/0882* (2013.01); *H01L 29/1095* (2013.01); *H01L 29/66681* (2013.01)

(58) Field of Classification Search
CPC ........... H01L 29/7816; H01L 29/66659; H01L 29/0878; H01L 29/66681; H01L 29/0653; H01L 29/1095; H01L 29/0649
USPC ........................................ 257/343
See application file for complete search history.

(56) References Cited

U.S. PATENT DOCUMENTS

| | | | |
|---|---|---|---|
| 2007/0187766 A1* | 8/2007 | Wu ...................... | H01L 29/0653 257/368 |
| 2012/0126324 A1* | 5/2012 | Takeda ................ | H01L 29/7816 257/343 |
| 2014/0183687 A1* | 7/2014 | Cai ..................... | H01L 29/0649 257/510 |

* cited by examiner

*Primary Examiner* — Theresa T Doan
(74) *Attorney, Agent, or Firm* — Winston Hsu

(57) ABSTRACT

A high voltage semiconductor device includes a semiconductor substrate, a gate structure, a drift region, a drain region, and an isolation structure. The gate structure is disposed on the semiconductor substrate. The drift region is disposed in the semiconductor substrate and partially disposed at a side of the gate structure. The drain region is disposed in the drift region. The isolation structure is at least partially disposed in the drift region. A part of the isolation structure is disposed between the drain region and the gate structure. A top of the isolation structure includes a flat surface, and a bottom of the isolation structure includes a curved surface.

16 Claims, 13 Drawing Sheets

HIGH VOLTAGE SEMICONDUCTOR DEVICE AND MANUFACTURING METHOD THEREOF

BACKGROUND OF THE INVENTION

1. Field of the Invention

The present invention relates to a high voltage semiconductor device and a manufacturing method thereof, and more particularly, to a high voltage semiconductor device including an isolation structure and a manufacturing method thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency (HF) band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. However, the drain-source on-state resistance (Ron) will increase as the area of the device increases, and negative influence may occur accordingly. Therefore, for the related fields, it is important to find out the method for improving the ratio of the on-resistance to the breakdown voltage by design.

SUMMARY OF THE INVENTION

A high voltage semiconductor device and a manufacturing method thereof are provided in the present invention. The electrical performance of the high voltage semiconductor device is improved by an isolation structure wherein a top of the isolation structure includes a flat surface and a bottom of the isolation structure includes a curved surface.

According to an embodiment of the present invention, a high voltage semiconductor device is provided. The high voltage semiconductor device includes a semiconductor substrate, a gate structure, a drift region, a drain region, and an isolation structure. The gate structure is disposed on the semiconductor substrate. The drift region is disposed in the semiconductor substrate and partially disposed at a side of the gate structure. The drain region is disposed in the drift region. The isolation structure is at least partially disposed in the drift region, and a part of the isolation structure is disposed between the drain region and the gate structure. A top of the isolation structure includes a flat surface, and a bottom of the isolation structure includes a curved surface.

According to an embodiment of the present invention, a manufacturing method of a high voltage semiconductor device is provided. The manufacturing method includes the following steps. Firstly, a semiconductor substrate is provided. A drift region is formed in the semiconductor substrate. An isolation structure is formed, and the isolation structure is at least partially disposed in the drift region. A top of the isolation structure includes a flat surface, and a bottom of the isolation structure includes a curved surface. A gate structure is formed on the semiconductor substrate, and the drift region is partially disposed at a side of the gate structure. A drain region is formed in the drift region, and a part of the isolation structure is disposed between the drain region and the gate structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-10 are schematic drawings illustrating a manufacturing method of the high voltage semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
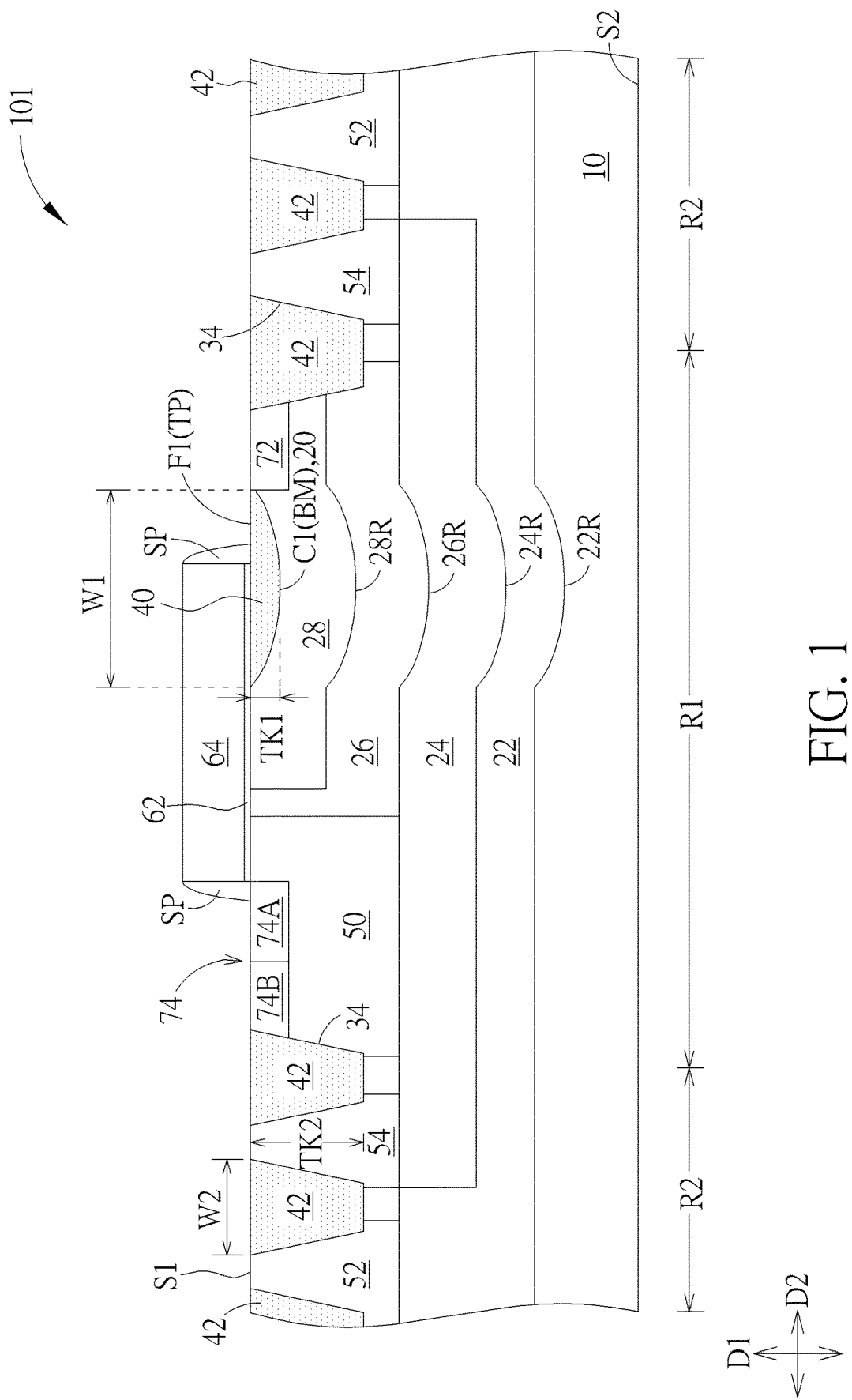
FIG. 1 is a schematic drawing illustrating a high voltage semiconductor device according to a first embodiment of the present invention.

Please refer to FIG. 1. FIG. 1 is a schematic drawing illustrating a high voltage semiconductor device according to a first embodiment of the present invention. As shown in FIG. 1, a high voltage semiconductor device 101 is provided in this embodiment, and the high voltage semiconductor device 101 includes a semiconductor substrate 10, a gate structure 64, a drift region 28, a drain region 72, and an isolation structure 40. The gate structure 64 is disposed on the semiconductor substrate 10. The drift region 28 is disposed in the semiconductor substrate 10 and partially disposed at a side of the gate structure 64. The drain region 72 is disposed in the drift region 28. The isolation structure 40 is at least partially disposed in the drift region 28, and a part of the isolation structure 40 is disposed between the drain region 72 and the gate structure 64. Atop TP of the isolation structure 40 includes a flat surface F1, and a bottom BM of the isolation structure 40 includes a curved surface C1. A relatively larger depletion region may be generated and the electrical field effect may be reduced by the disposition of the isolation structure 40, and the electrical performance of the high voltage semiconductor device 101, such as breakdown voltage ($V_{BD}$), hot carrier injection (HCI), and so on, may be improved accordingly. The negative influence of the isolation structure 40 on the drift region 28 may be improved by the disposition of the isolation structure 40 with the bottom BM having the curved surface C1. That will be beneficial for other electrical performance of the high voltage semiconductor device 101, such as reducing the drain-source on-state resistance ($R_{on}$) of the high voltage semiconductor device 101, and the ratio of the drain-source on-state resistance to the breakdown voltage ($R_{on}/V_{BD}$) of the high voltage semiconductor device 101 may be lowered accordingly, but not limited thereto. In addition, the negative influence of the isolation structure 40 on manufacturing processes of other parts (such as the influence on the manufacturing process of forming the gate structure 64) may be reduced by the disposition of the isolation structure 40 with the top TP having the flat surface F1, and that will be beneficial for process integration and/or process simplification.

Specifically, in some embodiments, the high voltage semiconductor device 101 may further include a first well region 26, a body region 50, a source region 74, a dielectric layer 62, and a spacer SP. The first well region 26 may be disposed in the semiconductor substrate 10, and at least a part of the first well region 26 may be disposed under the drift region 28 in a vertical direction (such as a first direction D1 shown in FIG. 1). The body region 50 may be disposed in the semiconductor substrate 10 and be disposed adjacent to the first well region 26 in a horizontal direction (such as a second direction D2 shown in FIG. 1). The source region 74 and the drain region 72 may be disposed in the semiconductor substrate 10 at two opposite sides of the gate structure 64 in the second direction D2 respectively, and the source region may be at least partially disposed in the body region 50. The dielectric layer 62 may be disposed between the gate structure 64 and the semiconductor substrate 10, and the spacer SP may be disposed on sidewalls of the gate structure 64.

In some embodiments, the first direction D1 described above may be regarded as a thickness direction of the semiconductor substrate 10. The semiconductor substrate 10 has a top surface S1 and a bottom surface S2 opposite to the top surface S1 in the first direction D1, and a horizontal direction (such as the second direction D2 shown in FIG. 1) substantially orthogonal to the first direction D1 may be parallel with the top surface S1 and/or the bottom surface S2 of the semiconductor substrate 10, but not limited thereto. Additionally, in this description, a distance between the bottom surface S2 of the semiconductor substrate 10 and a relatively higher location and/or a relatively higher part in the first direction D1 is greater than a distance between the bottom surface S2 of the semiconductor substrate 10 and a relatively lower location and/or a relatively lower part in the first direction D1. The bottom of each part may be closer to the bottom surface S2 of the semiconductor substrate 10 in the first direction D1 than the top of this part. Another part disposed above a specific part may be regarded as being relatively far from the bottom surface S2 of the semiconductor substrate 10 in the first direction D1, and another part disposed under a specific part may be regarded as being relatively closer to the bottom surface S2 of the semiconductor substrate 10 in the first direction D1.

In some embodiments, the flat surface F1 of the isolation structure 40 may be the topmost surface of the isolation structure 40 in the first direction, the curved surface C1 may include a curved surface protruding towards the bottom surface S2 of the semiconductor substrate 10, and the bottommost part of the isolation structure 40 in the first direction D1 may be a portion of the curved surface C1 closest to the bottom surface S2 of the semiconductor substrate 10, but not limited thereto. In addition, the curved surface C1 may be directly connected with the flat surface F1, and a cross-sectional shape of the isolation structure 40 may be similar to a half-moon shape, but not limited thereto. In some embodiments, a width W1 of the isolation structure 40 in the second direction D2 (may also be regarded as a length of the isolation structure 40 in the second direction D2) may be greater than a thickness TK1 of the isolation structure 40 in the first direction D1, and an aspect ratio, which may be substantially equal to a ratio of the thickness TK1 to the width W1 (TK1/W1) may be less than 1, but not limited thereto. The path of electrons in the high voltage semiconductor device 101 may be shortened by the disposition of the relatively shallower isolation structure 40, and the drain-source on-state resistance of the high voltage semiconductor device 101 may be reduced accordingly. In addition, the isolation structure 40 in the present invention may not protrude upwards significantly for avoiding generating unevenness on the surface and affecting the manufacturing process of forming other components (such as the process of forming the gate structure 64). For example, in some embodiments, the flat surface F1 of the isolation structure 40 and the top surface S1 of the semiconductor substrate 10 may be substantially coplanar or the flat surface F1 of the isolation structure 40 may be slightly higher than the top surface S1 of the semiconductor substrate 10, but not limited thereto.

In some embodiments, the semiconductor substrate 10 may include a silicon substrate, an epitaxial silicon substrate, a silicon germanium substrate, a silicon carbide substrate, a silicon-on-insulator (SOI) substrate, or a substrate formed of other suitable semiconductor materials and/or other suitable structures. In some embodiments, the first well region 26, the drift region 28, the drain region 72, and the source region 74 may include doped regions formed by doping processes (such as implantation processes). In some embodiments, the semiconductor substrate 10 may have a first conductivity type or include a first conductivity type region preferably, the drift region 28 and the first well region 26 may have a second conductivity type preferably, and the first conductivity type is complementary to the second conductivity type. For example, in this embodiment, the first conductivity type may be p-type and the second conductivity type may be n-type, but not limited thereto. In other words, the semiconductor substrate 10 may be a p-type semiconductor substrate or a semiconductor substrate including a p-type well, the first well region 26 may be an n-type doped well region, and the drift region 28 may be an n-type doped drift region, but not limited thereto. In some embodiments, the first conductivity type may be n-type and the second conductivity type may be p-type. Additionally, in some embodiments, the body region 50 may include a first conductivity type lightly doped region, the drain region 72 may include a second conductivity type heavily doped region, and the source region 74 may include a second conductivity type heavily doped region (such as a first doped region 74A shown in FIG. 1) and a first conductivity type heavily doped region (such as a second doped region 74B shown in FIG. 1), but not limited thereto. In some embodiments, the first doped region 74A and the second doped region 74B may be directly connected with each other, the first doped region 74A may be located between the gate structure 64 and the second doped region 74B in the second direction D2, and a conductive layer (such as a conductive metal silicide layer, not shown) may be disposed on the first doped region 74A and the second doped region 74B for being electrically connected with the first doped region 74A and the second doped region 74B, but not limited thereto. In addition, the isolation structure 40 may include a single layer or multiple layers of insulation materials, such as oxide insulation materials, (e.g. silicon oxide, polysilazane) or other suitable insulation materials.

In some embodiments, the drift region 28 may include a first curved bottom 28R, and the first well region 26 may include a second curved bottom 26R. The first curved bottom 28R may be disposed corresponding to the isolation structure 40 in the first direction D1, and the second curved bottom 26R may be disposed corresponding to the first curved bottom 28R of the drift region 28 and the isolation structure 40 in the first direction D1. For example, the first curved bottom 28R and the second curved bottom 26R may protrude towards the bottom surface S2 of the semiconductor substrate 10, and the second curved bottom 26R may overlap the first curved bottom 28R and the isolation structure 40 in the first direction D1. Additionally, in some embodiments, the first curved bottom 28R may be the bottommost portion of the drift region 28 in the first direction D1, and the second curved bottom 26R may be the bottommost part of the first well region 26 in the first direction, but not limited thereto. The difference between the electrical resistance of the drift region 28 disposed under the isolation structure 40 and the electrical resistance of other portions of the drift region 28 may be reduced by the disposition of the first curved bottom 28R and/or the second curved bottom 26R, and that will be helpful to the reduction of the drain-source on-state resistance of the high voltage semiconductor device 101.

In some embodiments, the dielectric layer 62, the gate structure 64, and the spacer SP may be disposed on the top surface S1 of the semiconductor substrate 10, and the gate structure 64 may partially overlap the first well region 26, the drift region 28, the isolation structure 40, and the body region 50 in the first direction D1 respectively. In some embodiments, the dielectric layer 62 may include oxide (such as silicon oxide) or other suitable dielectric materials, and the gate structure 64 may include a conductive non-metallic gate electrode (such as a conductive polysilicon gate electrode), a metal gate electrode, or a gate structure made of other suitable materials. In addition, the spacer SP may include a single layer or multiple layers of dielectric materials, such as silicon oxide, silicon nitride, silicon oxynitride, or other suitable dielectric materials. It is worth noting that the gat structure 64 may be formed by a replacement metal gate (RMG) process to be a gate structure including a gate dielectric layer, a work function layer, and a low resistivity layer stacked with one another because the top TP of the isolation structure 40 includes the flat surface F1 and the isolation structure 40 may not protrude upwards significantly, but not limited thereto. The dielectric layer described above may include high dielectric constant (high-k) materials, such as hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The work function layer described above may include titanium nitride (TiN), titanium carbide (TiC), tantalum nitride (TaN), tantalum carbide (TaC), tungsten carbide (WC), titanium tri-aluminide ($TiAl_3$), aluminum titanium nitride (TiAlN), or other suitable conductive work function materials. The low resistivity layer described above may include tungsten, aluminum, copper, titanium aluminide, titanium, or other suitable low electrical resistivity materials.

In some embodiments, a first region R1 and a second region R2 may be defined on the semiconductor substrate 10. In some embodiments, the first region R1 and the second region R2 may be disposed adjacent to each other. The first well region 26, the drift region 28, the body region 50, the drain region 72, the source region 74, the dielectric layer 62, the gate structure 64, and the spacer SP described above may be disposed in the first region R1 or disposed on the first region R1, and the first region R1 may be regarded as a high voltage unit region, but not limited thereto. In some embodiments, the high voltage semiconductor device 101 may further include a second well region 24, a third well region 22, a plurality of trench isolation structures 42, a fourth well region 52, and a fifth well region 54. The second well region 24, the third well region 22, the fourth well region 52, and the fifth well region 54 are disposed in the semiconductor substrate 10. The second well region 24 may be partly disposed in the first region R1 and partly disposed in the second region R2, the third well region 22 may be partly disposed in the first region R1 and partly disposed in the second region R2, the fourth well region 52 may be disposed in the second region R2 and disposed above the third well region 22, and the fifth well region 54 may be disposed in the second region R2 and disposed above the second well region 24. The second well region 24 disposed in the first region R1 may be located under the first well region 26, and the third well region 22 may be disposed under the second well region 24. In addition, each of the trench isolation structures 42 may be at least partially disposed in the semiconductor substrate 10, and some of the trench isolation structures 42 may be disposed at the interface between the first region R1 and the second region R2 and/or disposed between the fourth well region 52 and the fifth well region 54, but not limited thereto. The trench isolation structure 42 may include a single layer or multiple layers of insulation materials, such as oxide insulation materials, (e.g. silicon oxide, polysilazane) or other suitable insulation materials. It is worth noting that a thickness TK2 of the trench isolation structure 42 in the first direction D1 may be different from the thickness TK1 of the isolation structure 40 in the first direction, and a width W2 of the trench isolation structure 42 in the second direction D2 (may also be regarded as a length of the trench isolation structure 42 in the second direction D2) may be different from the width W1 of the isolation structure 40 in the second direction D2. For example, a ratio of the thickness TK2 to the width W2 (TK2/W2) of the trench isolation structure 42 may be greater than a ratio of the thickness TK1 to the width W1 (TK1/W1) of the isolation structure 40, and the thickness TK2 of the trench isolation structure 42 may be greater than the thickness TK1 of the isolation structure 40, but not limited thereto.

In some embodiments, a conductivity type of the second well region 24 may be complementary to a conductivity type of the first well region 26, a conductivity type of the third well region 22 may be complementary to the conductivity type of the second well region 24, a conductivity type of the fourth well region 52 may be identical to the conductivity type of the third well region 22, and a conductivity type of the fifth well region 54 may be identical to the conductivity type of the second well region 24, but not limited thereto. For example, when the first conductivity type is p-type and the second conductivity type is n-type, the second well region 24 may be regarded as a p-type doped deep well region, the third well region 22 may be regarded as an n-type doped deep well region, the fourth well region 52 may be regarded as an n-type doped well region, and the fifth well region 54 may be regarded as a p-type doped well region, but not limited thereto. Additionally, in some embodiments, the fourth well region 52 and the fifth well region 54 may be used to form other semiconductor units, such as input/output (I/O) semiconductor units (not shown), and the second region R2 may be regarded as an input/output region, but not limited thereto.

In some embodiments, the second well region 24 may include a third curved bottom 24R, and the third well region 22 may include a fourth curved bottom 22R. The third curved bottom 24R may be disposed corresponding to the second curved bottom 26R of the first well region 26, the first curved bottom 28R of the drift region 28, and the isolation structure 40 in the first direction D1, and the fourth curved bottom 22R may be disposed corresponding to the third curved bottom 24R of the second well region 24, the second curved bottom 26R of the first well region 26, the first curved bottom 28R of the drift region 28, and the isolation structure 40 in the first direction D1. For example, the third curved bottom 24R and the fourth curved bottom 22R may protrude towards the bottom surface S2 of the semiconductor substrate 10, and the fourth curved bottom 22R may overlap the third curved bottom 24R, the second curved bottom 26R, the first curved bottom 28R, and the isolation structure 40 in the first direction D1. Additionally, in some embodiments, the third curved bottom 24R may be the bottommost part of the second well region 24 in the first direction D1, and the fourth curved bottom 22R may be the bottommost part of the third well region 22 in the first direction D1

Figure 2:
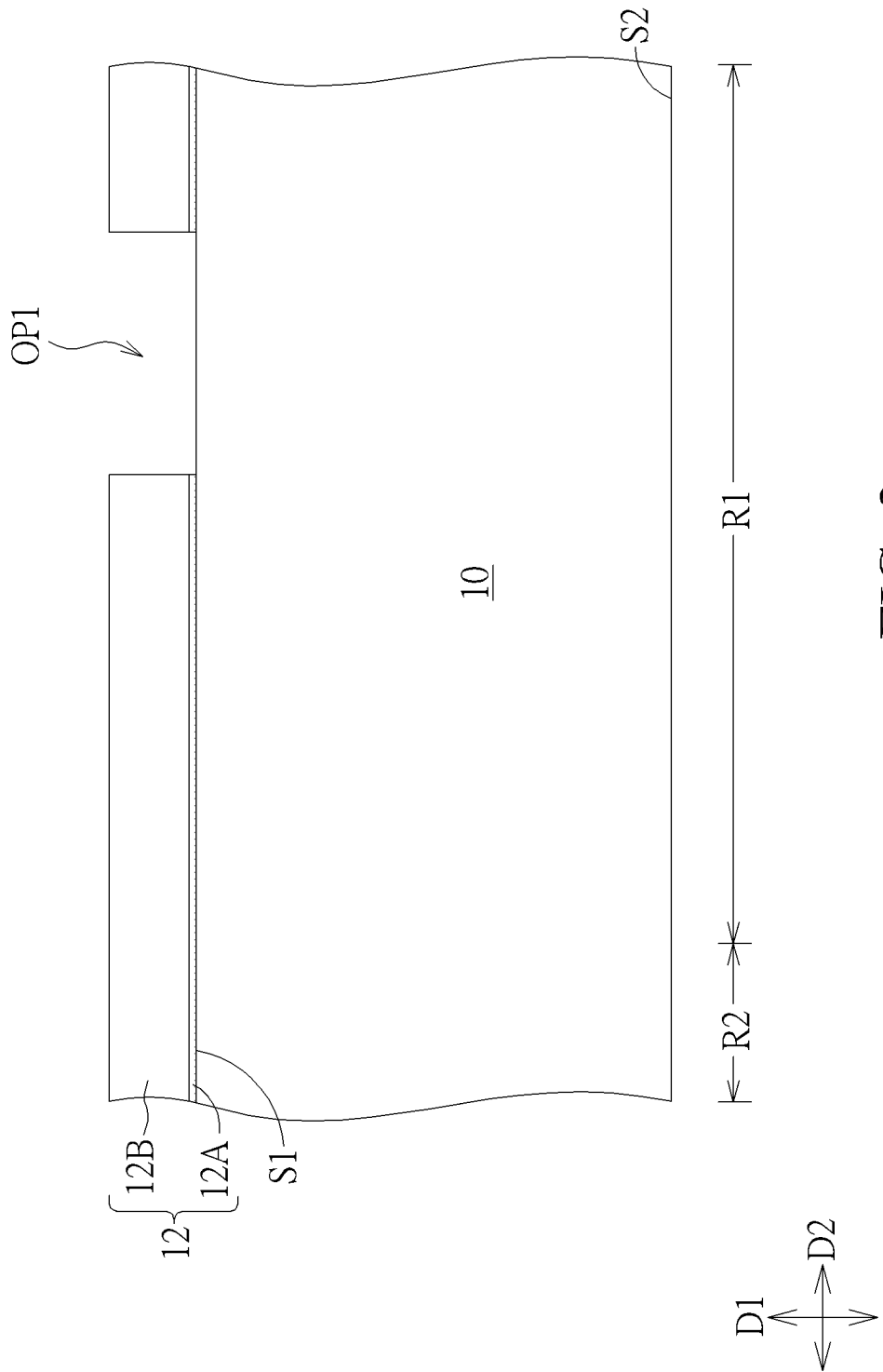
Figure 3:
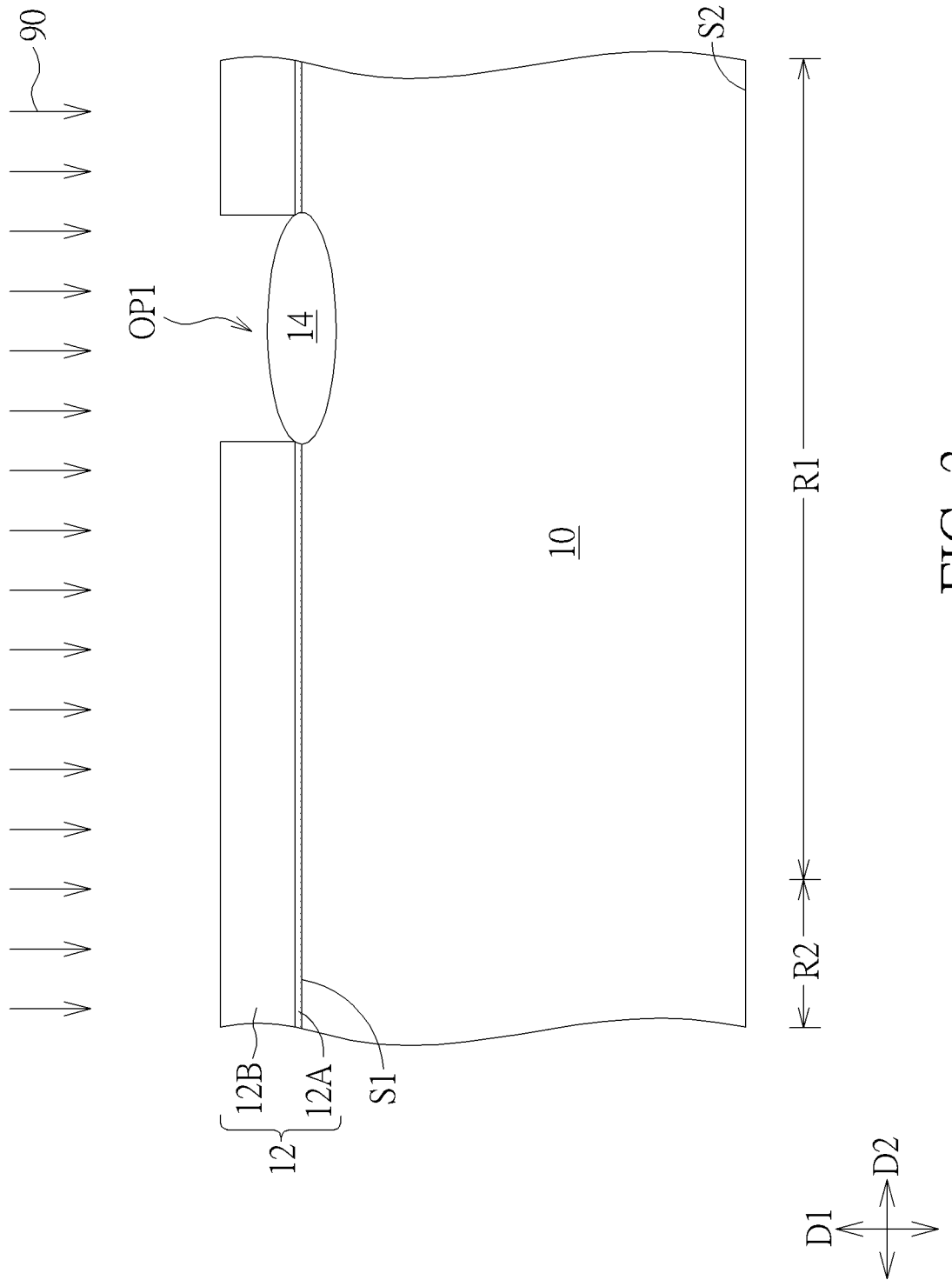
Figure 4:
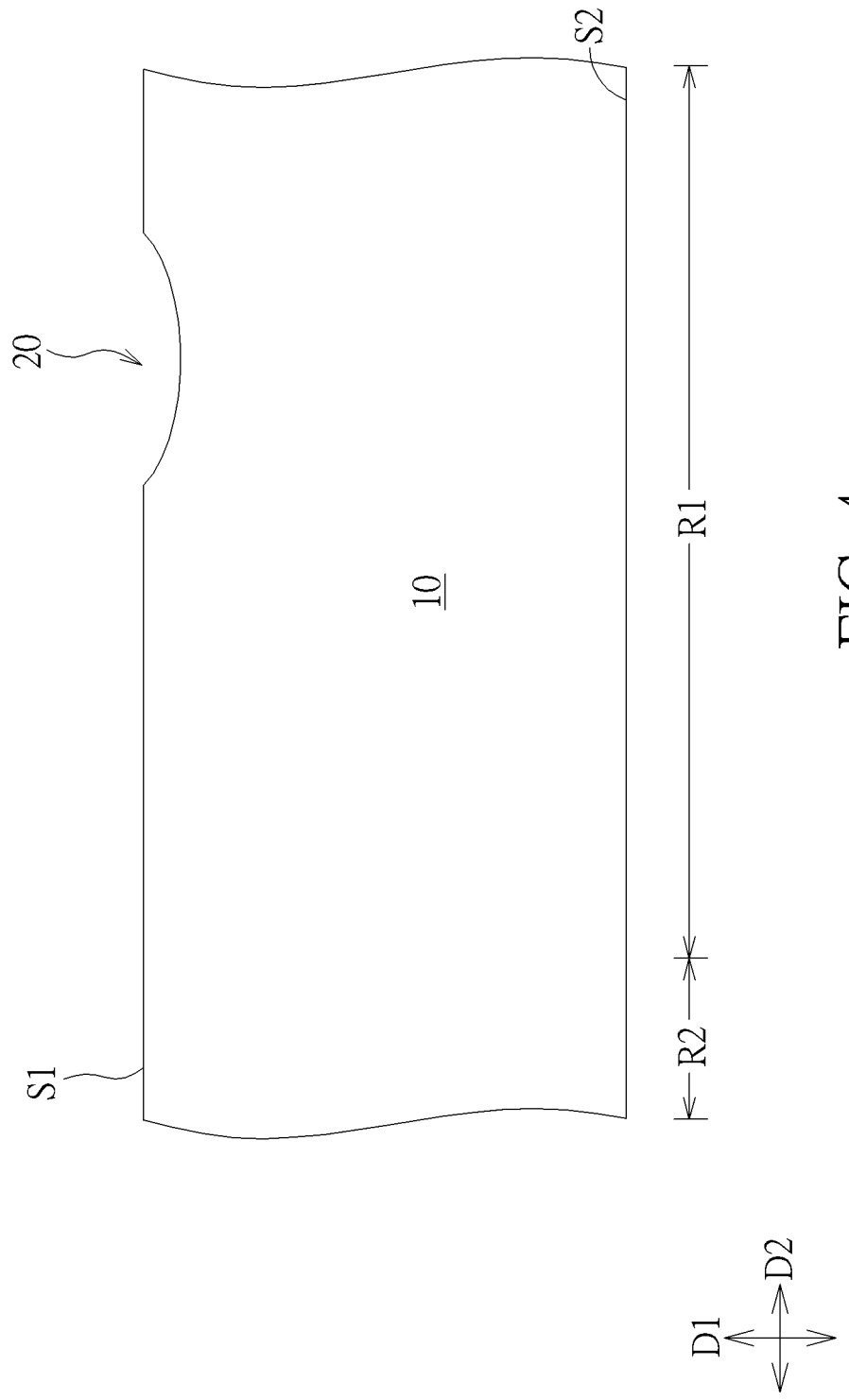
Figure 5:
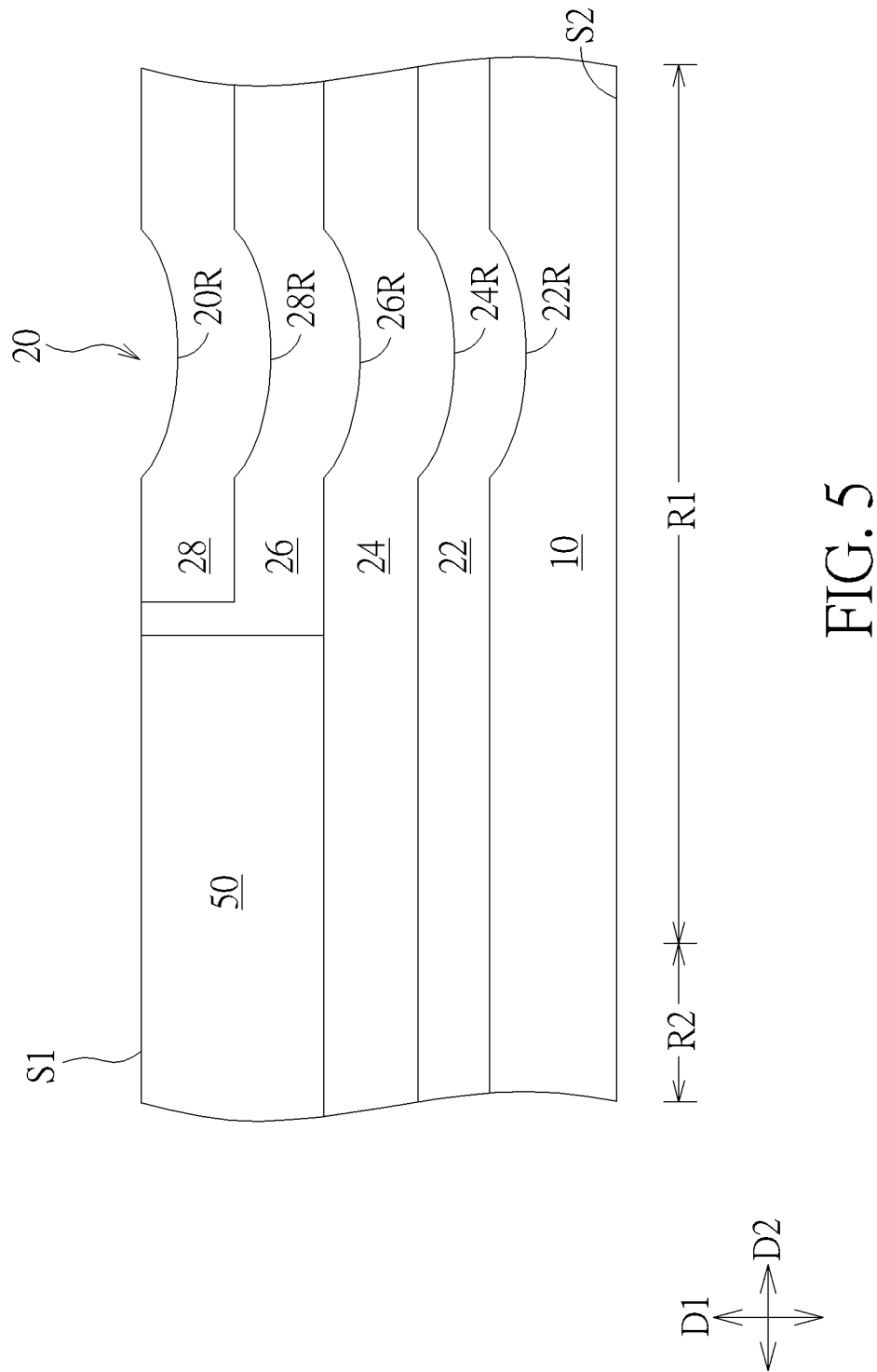
Figure 6:
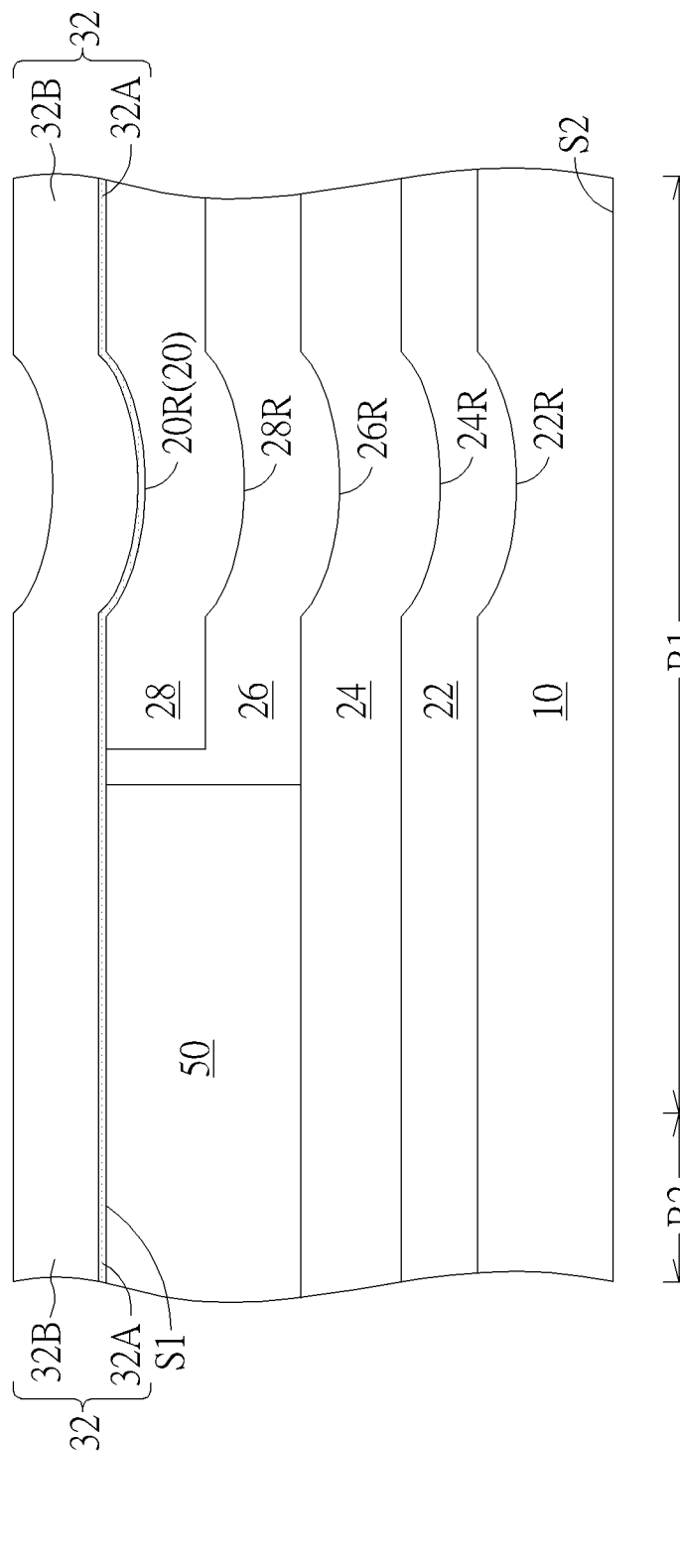
Figure 7:
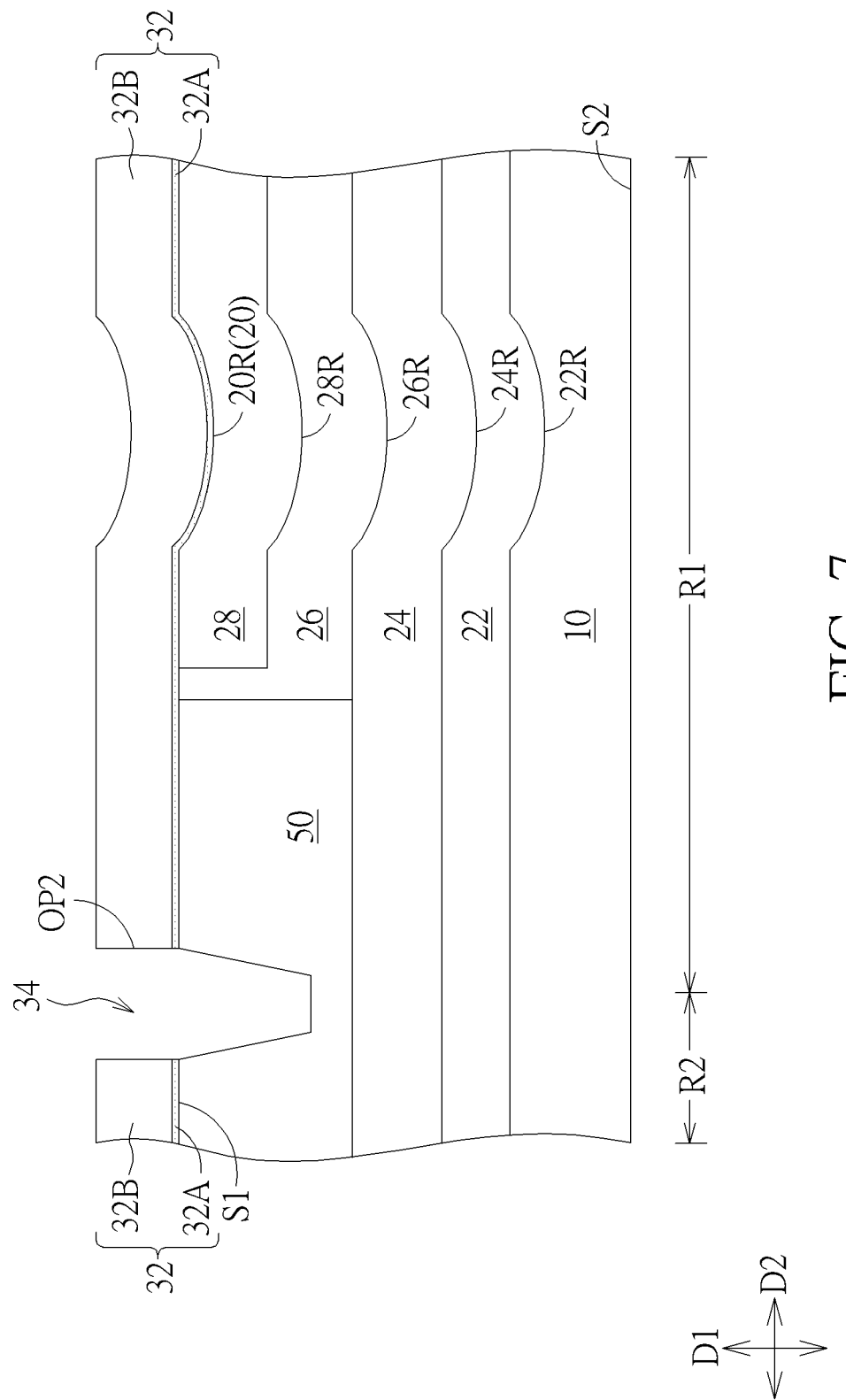
Figure 8:
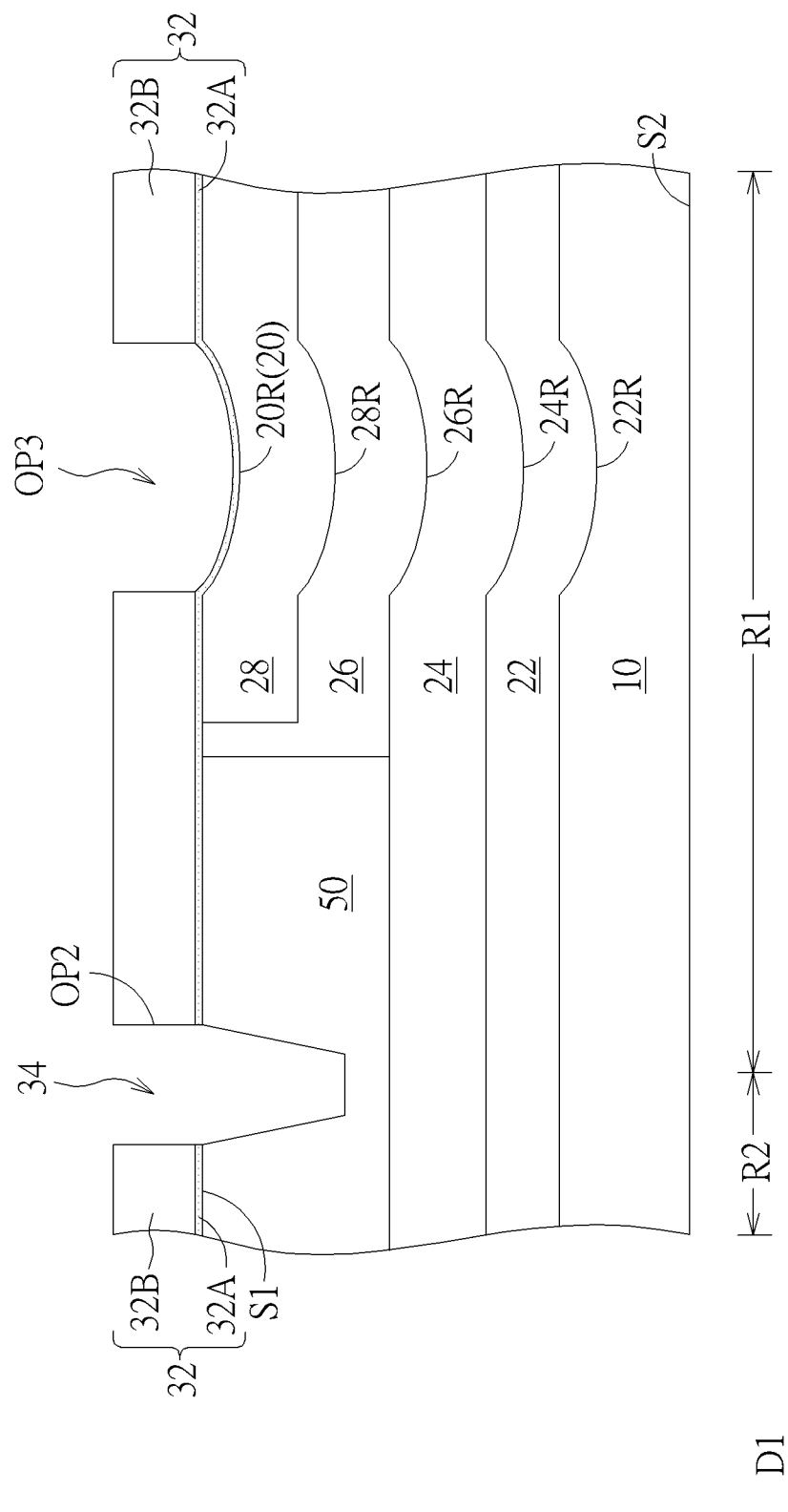
Figure 9:
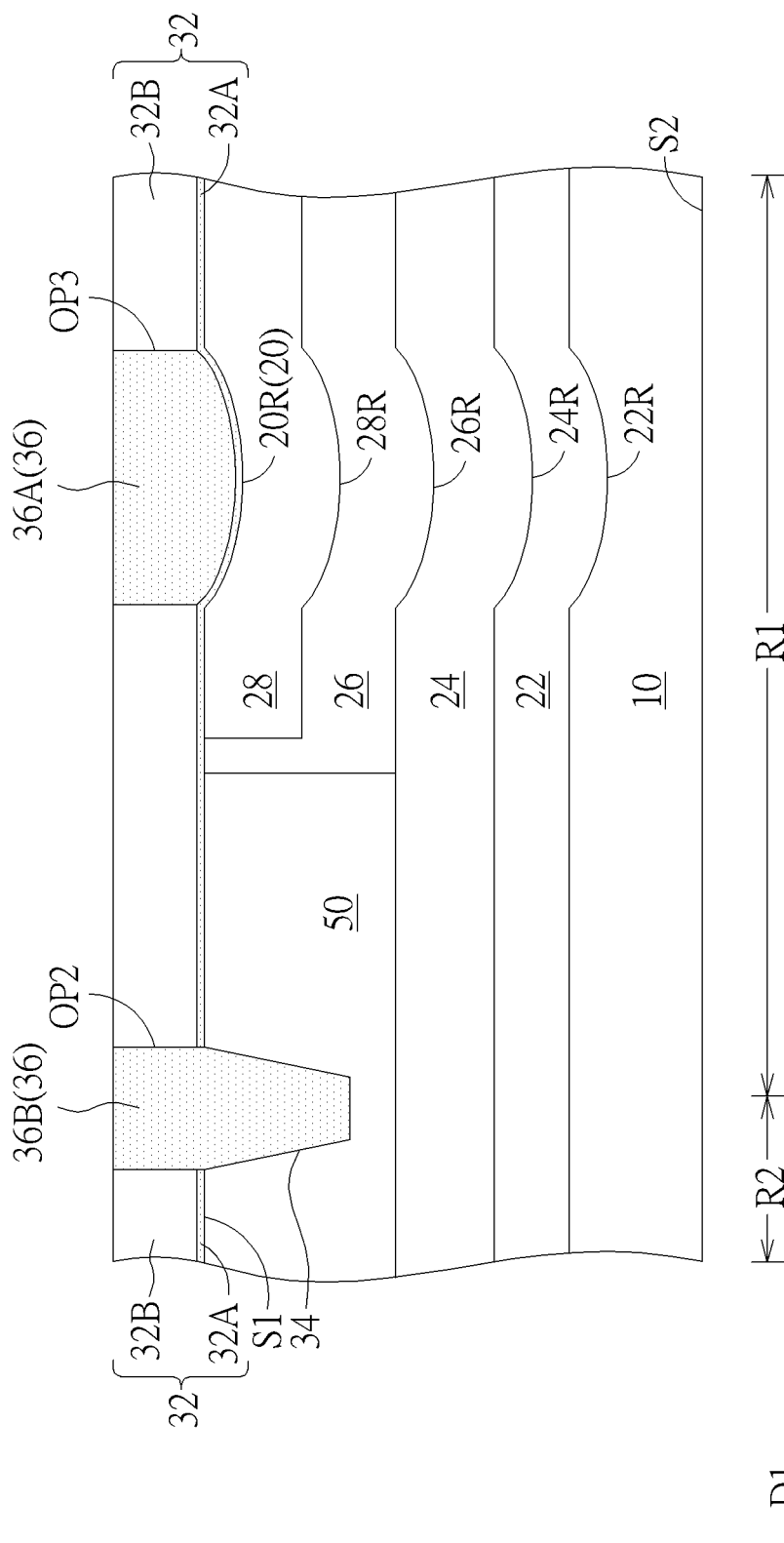
Figure 10:
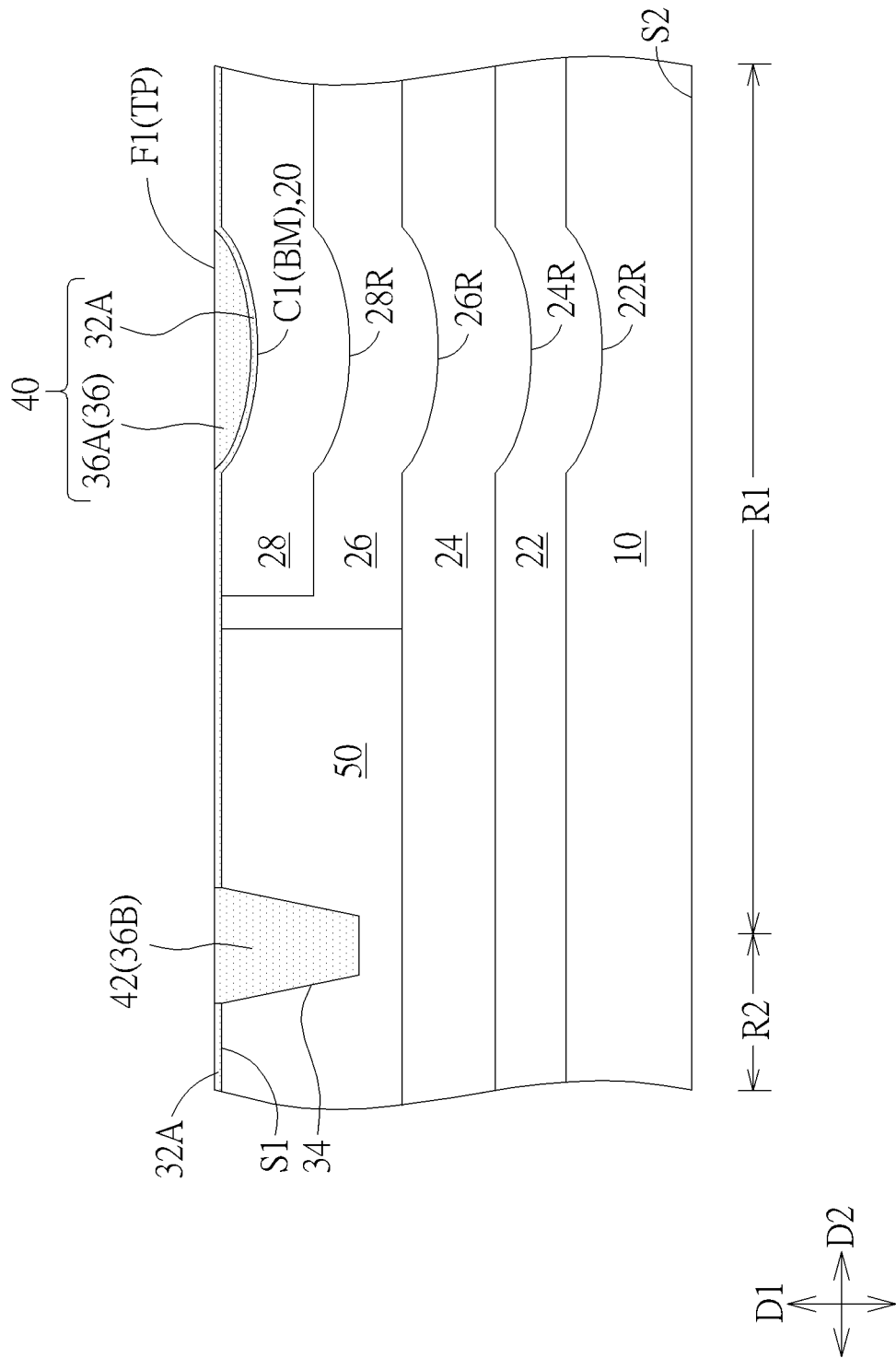

Please refer to FIGS. 1-10. FIGS. 2-10 are schematic drawings illustrating a manufacturing method of the high voltage semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 1 may be regarded as a schematic drawing in a step subsequent to FIG. 10. As shown in FIG. 1, the manufacturing method of the high voltage semiconductor device 101 in this embodiment may include the following steps. Firstly, the semiconductor substrate 10 is provided. The drift region 28 is formed in the semiconductor substrate 10. The isolation structure 40 is formed, and the isolation structure 40 is at least partially disposed in the drift region 28. The top TP of the isolation structure 40 includes the flat surface F1, and the bottom BM of the isolation structure 40 includes the curved surface C1. The gate structure 64 is formed on the semiconductor substrate 10, and the drift region 28 is partially disposed at a side of the gate structure 64. The drain region 72 is formed in the drift region 28, and a part of the isolation structure 40 is disposed between the drain region 72 and the gate structure 64. In some embodiments, the isolation structure may be at least partially formed within a recess 20 located in the semiconductor substrate 10, and the recess 20 may be formed before the step of forming the drift region 28, but not limited thereto.

Specifically, in some embodiments, the manufacturing method of the high voltage semiconductor device 101 may include but is not limited to the following steps. Firstly, as shown in FIG. 2, the semiconductor substrate 10 is provided, a patterned mask layer 12 is formed on the top surface S1 of the semiconductor substrate 10, and the patterned mask layer 12 may include an opening OP1 exposing the semiconductor substrate 10 partially. In some embodiments, the patterned mask layer 12 may be formed on the first region R1 and the second region R2, and the opening OP1 may partially expose the first region R1 of the semiconductor substrate 10. Additionally, in some embodiments, the patterned mask layer 12 may include a single layer structure or a multiple layer structure. For instance, the patterned mask layer 12 may include a first layer 12A and a second layer 12B disposed on the first layer 12A, the first layer 12A may include an oxide layer, and the second layer 12B may include a hard mask material, but not limited thereto. Subsequently, as shown in FIG. 3, an oxidation process 90 is performed, and a part of the semiconductor substrate 10 exposed by the opening OP1 may be oxidized to be an oxide layer 14 by the oxidation process 90. As shown in FIG. 3 and FIG. 4, the oxide layer 14 and the patterned mask layer 12 may then be removed for forming a recess 20 in the semiconductor substrate 10. It is worth noting that the method of forming the recess 20 in this invention is not limited to the condition described above, and other suitable approaches may also be used to form the recess 20 shown in FIG. 4 according to other design considerations.

Subsequently, as shown in FIG. 5, the third well region 22, the second well region 24, the first well region 26, and the drift region 28 described above may be formed in the semiconductor substrate 10. In some embodiments, suitable doping processes (such as implantation processes) may be performed to implant n-type dopants and/or p-type dopants into the semiconductor substrate 10 for forming the third well region 22, the second well region 24, the first well region 26, and the drift region 28 respectively. The n-type dopants described above may include phosphor (P), arsenic (As), or other suitable n-type doping materials, and the p-type dopants described above may include boron (B), gallium (Ga), or other suitable p-type doping materials. In some embodiments, the body region 50 (such as a lightly doped region having a conductivity type complementary to the conductivity type of the drift region 28) may be formed in the semiconductor substrate 10 by a suitable doping process, but not limited thereto. It is worth noting that because the third well region 22, the second well region 24, the first well region 26, and the drift region 28 are formed after the step of forming the recess 20 and the recess 20 may has a concave surface 20R protruding towards the bottom surface S2 of the semiconductor substrate 10, the third well region 22, the second well region 24, the first well region 26, and the drift region 28 may be influenced by the recess 20 and have curved bottoms formed corresponding to the concave surface 20R of the recess 20 in the first direction D1. For example, the first curved bottom 28R of the drift region 28 may be formed corresponding to the recess 20 in the first direction D1. The second curved bottom 26R of the first well region 26, the third curved bottom 24R of the second well region 24, and the fourth curved bottom 22R of the third well region 22 may be disposed corresponding to the first curved bottom 28R of the drift region 28 and the recess 20 in the first direction D1. Additionally, the influence of the isolation structure (not shown in FIG. 5) on the doping processes configured to form the third well region 22, the second well region 24, the first well region 26, and the drift region 28 may be avoided because the isolation structure, which is going to be formed in the recess 20, is formed after the steps of forming the third well region 22, the second well region 24, the first well region 26, and the drift region 28. Accordingly, the doping uniformity of the third well region 22, the second well region 24, the first well region 26, and the drift region 28 may be improved.

Subsequently, as shown in FIG. 6, a mask layer 32 may be formed covering the semiconductor substrate 10. In some embodiments, the mask layer 32 may include a first layer 32A and a second layer 32B. The material composition of the first layer 32A may be different from the material composition of the second layer 32B, and the thickness of the second layer 32B may be greater than the thickness of the first layer 32A, but not limited thereto. For example, the first layer 32A may include an oxide layer, and the second layer 32B may include a nitride layer, but not limited thereto. In some embodiments, the mask layer 32 may also be formed by other suitable materials according to other design considerations. In addition, a part of the first layer 32A and a part of the second layer 32B may fill the recess 20. In other words, the recess 20 may not be fully filled with the first layer 32A preferably for forming the isolation structure by subsequent processes. As shown in FIG. 7, an opening OP2 may be formed in the mask layer 32, and a patterning process (such as an etching process) may be performed by using the mask layer 32 having the opening OP2 for forming a trench 34 in the semiconductor substrate 10. Therefore, the trench 34 may be formed after the step of forming the drift region 28. Subsequently, as shown in FIG. 8, an opening OP3 may be formed penetrating through the second layer 32B of the mask layer 32 and expose a part of the first layer 32A of the mask layer 32. The opening OP3 may be formed corresponding to the recess 20 in the first direction D1, and the opening OP3 may expose the first layer 32A located in the recess 20 accordingly.

Subsequently, as shown in FIG. 9, an insulation material 36 may be formed and fill the trench 34 and the recess 20. For example, a first portion 36A of the insulation material 36 may fill the opening OP3 and be partly located in the recess, and the trench 34 and the opening OP2 may be filled with a second portion 36B of the insulation material 36, but not limited thereto. In some embodiments, the insulation material 36 may be a single layer structure or a multiple layer structure, such as a structure including an insulation liner layer and an insulation gap-filling material, but not limited thereto. The insulation liner layer described above may include an oxide insulation material or other suitable insulation materials, and the insulation gap-filling material described above may include spin on dielectric (SOD), an insulation material formed by a deposition process (such as a chemical vapor deposition process), or a structure formed by other suitable manufacturing approaches and/or other suitable materials. As shown in FIG. 10, the second layer 32B of the mask layer 32 and a part of the insulation material 36 may then be removed for forming the trench isolation structure 42 and the isolation structure 40. In other words, in some embodiments, the trench isolation structure 42 and the isolation structure 40 may be formed concurrently by an identical process for process simplification, but not limited thereto. In some embodiments, the trench isolation structure 42 and the isolation structure 40 may also be formed by different processes respectively according to some design considerations. In addition, the process used to remove the second layer 32B of the mask layer 32 and a part of the insulation material 36 described above may include an etching back process, a chemical mechanical polishing (CMP) process, or other suitable planarization approaches. In some embodiments, the trench isolation structure 42 may be at least partially disposed in the trench 34 and include the second portion 36B of the insulation material 36, and the isolation structure 40 may be at least partially disposed in the recess 20 and include the first portion 36A of the insulation material 36 and the first layer 32A of the mask layer 32, but not limited thereto.

As shown in FIG. 10 and FIG. 1, after the step of forming the trench isolation structure 42 and the isolation structure 40, the gate structure 64, the spacer SP, the drain region 72, and the source region 74 described above may then be formed. It is worth noting that the gate structure 64 may be formed by a replacement metal gate process for being integrated with processes of other semiconductor units on the semiconductor substrate 10 and process simplification because the top TP of the isolation structure 40 includes the flat surface F1 and the isolation structure 40 may not protrude upwards significantly from the top surface S1 of the semiconductor substrate 10. Therefore, in some embodiments, the topmost surface (such as the flat surface F1) of the isolation structure 40 in the first direction may be lower than the bottommost surface of the gate structure 64 in the first direction D1 for keeping the isolation structure 40 from influencing the manufacturing process of forming the gate structure 64, but not limited thereto. Additionally, in some embodiments, the dielectric layer 62, the gate structure 64, and the spacer SP may also be formed after removing the first layer 32A located outside the recess 20 according to some design considerations, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 11:
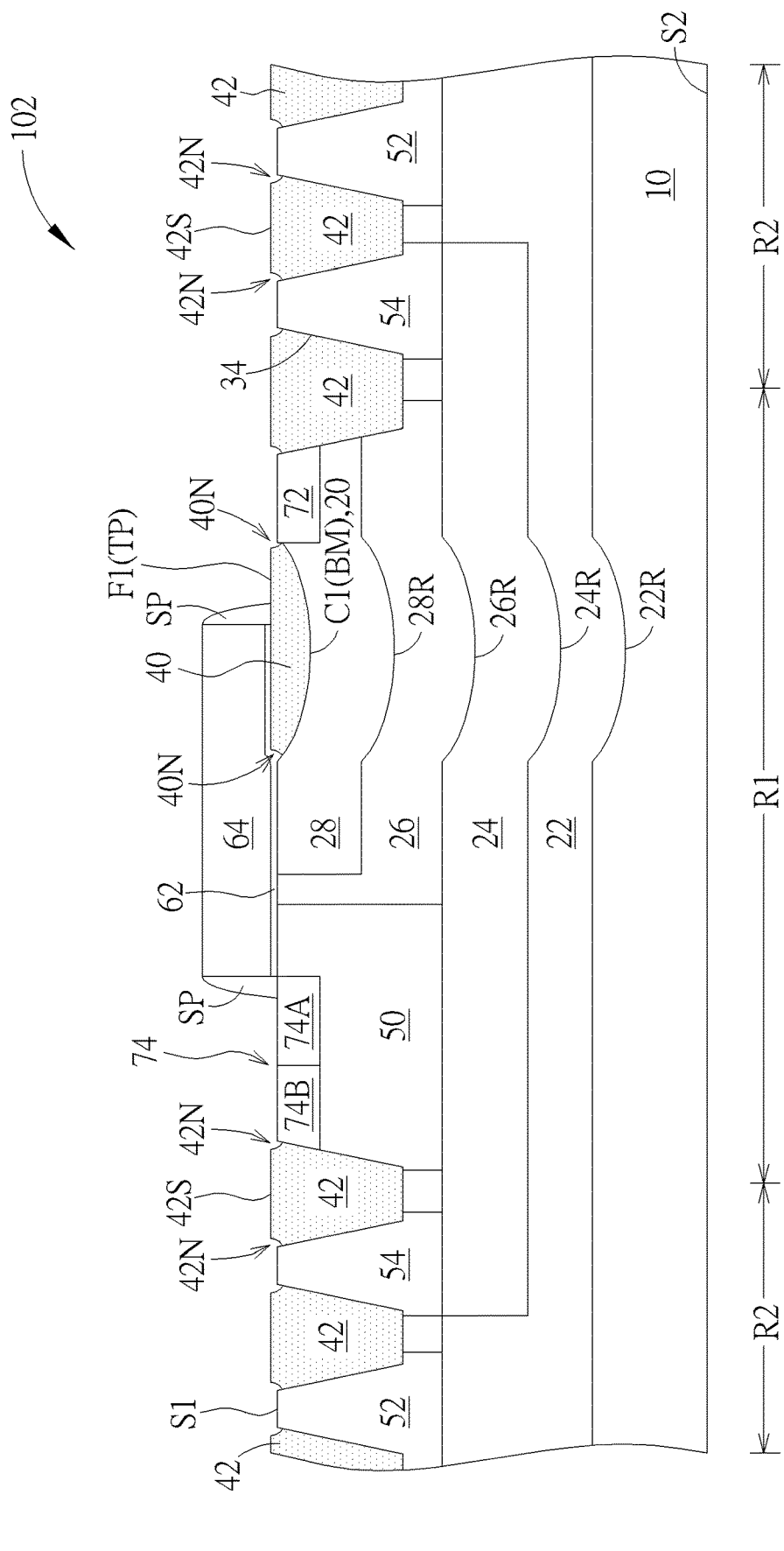
FIG. 11 is a schematic drawing illustrating a high voltage semiconductor device according to a second embodiment of the present invention.

Please refer to FIG. 11. FIG. 11 is a schematic drawing illustrating a high voltage semiconductor device 102 according to a second embodiment of the present invention. As shown in FIG. 11, the difference between the first embodiment described above and this embodiment is that, in the high voltage semiconductor device 102, the isolation structure 40 may include a first notch 40N disposed at an edge of the top TP of the isolation structure 40, and the flat surface F1 of the isolation structure 40 may be higher than the top surface S1 of the semiconductor substrate 10 in the first direction D1. In some embodiments, the trench isolation structure 42 may include a second notch 42N disposed at an edge of a top surface 42S of the trench isolation structure 42, and the top surface 42S of the trench isolation structure 42 may be higher than the top surface S1 of the semiconductor substrate 10 in the first direction D1. The first notch 40N and the second notch 42N described above may be formed by modifying the material composition of the layers in the insulation material 36 shown in FIG. 9 and/or modifying the process shown in FIG. 9 and FIG. 10 for removing the second layer 32B of the mask layer 32 and a part of the insulation material 36, but not limited thereto. The area where a gate structure of a semiconductor unit located corresponding to the first notch 40N and/or the second notch 42N overlaps the semiconductor substrate 10 may be increased by the disposition of the first notch 40N and/or the second notch 42N, and the related electrical performance of the semiconductor unit may be improved accordingly. It is worth noting that the first notch 40N and/or the second notch 42N in this embodiment may also be applied in other embodiments of the present invention according to some design considerations.

Figure 12:
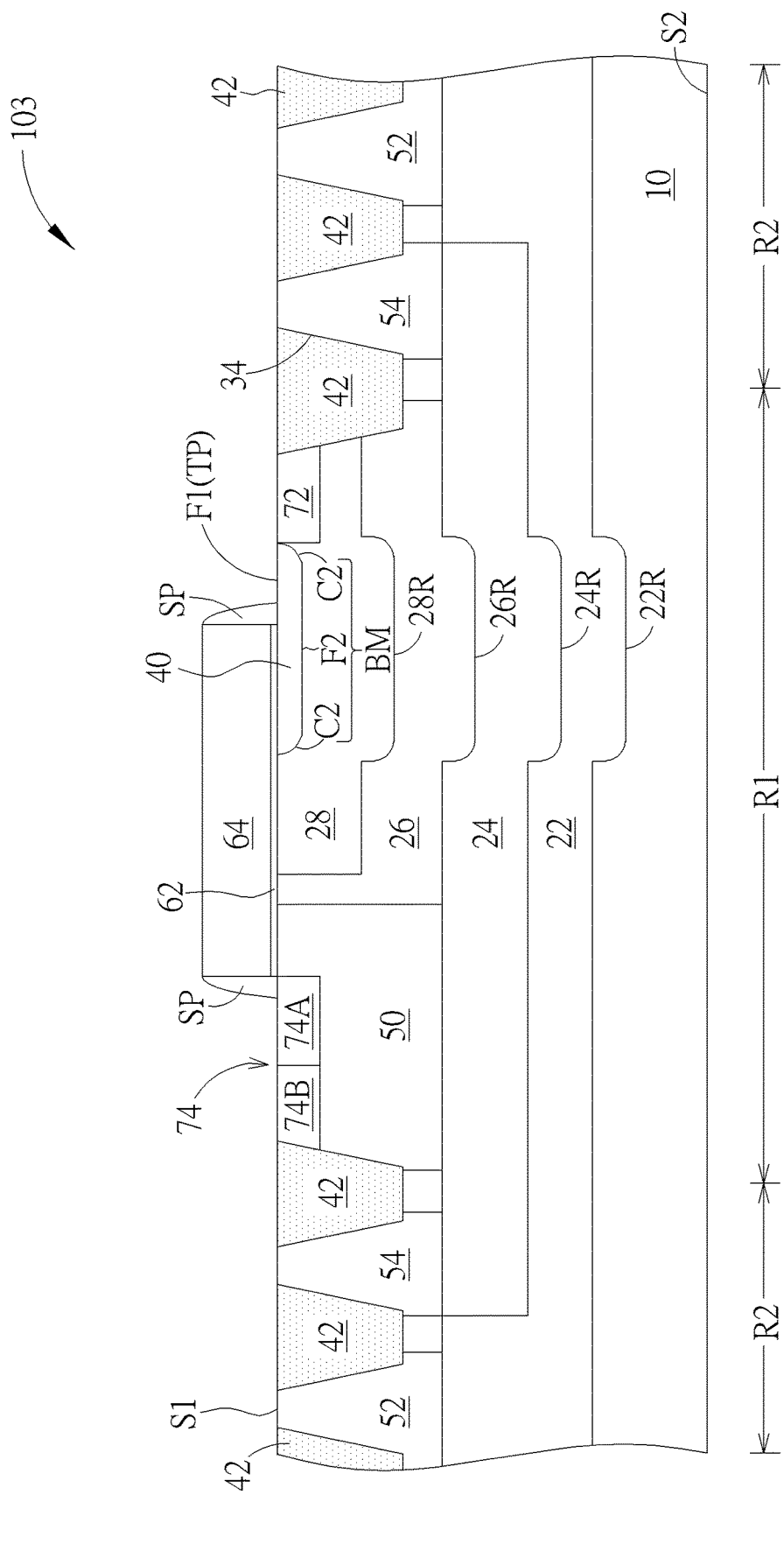
FIG. 12 is a schematic drawing illustrating a high voltage semiconductor device according to a third embodiment of the present invention.

Please refer to FIG. 12. FIG. 12 is a schematic drawing illustrating a high voltage semiconductor device 103 according to a third embodiment of the present invention. As shown in FIG. 12, the difference between the first embodiment described above and this embodiment is that, in the high voltage semiconductor device 103, the bottom BM of the isolation structure 40 may include a curved surface C2 and a flat surface F2, the flat surface F2 may be connected with the curved surface C2, and the flat surface F2 may be regarded as the bottommost surface of the isolation structure 40 in the first direction D1. In some embodiments, one end of the curved surface C2 may be directly connected with the flat surface F2, and another end of the curved surface C2 may be directly connected with the flat surface F1 of the top TP of the isolation structure 40, but not limited thereto. Additionally, in the high voltage semiconductor device 103, the shape of the first curved bottom 28R of the drift region 28, the shape of the second curved bottom 26R of the first well region 26, the shape of the third curved bottom 24R of the second well region 24, and/or the shape of the fourth curved bottom 22R of the third well region 22 may include a flat surface and a curved surface similar to the bottom BM of the isolation structure 40, but not limited thereto. It is worth noting that the shape of the bottom BM of the isolation structure 40, the shape of the first curved bottom 28R of the drift region 28, the shape of the second curved bottom 26R of the first well region 26, the shape of the third curved bottom 24R of the second well region 24, and/or the shape of the fourth curved bottom 22R of the third well region 22 in this embodiment may also be applied in other embodiments of the present invention according to some design considerations.

Figure 13:
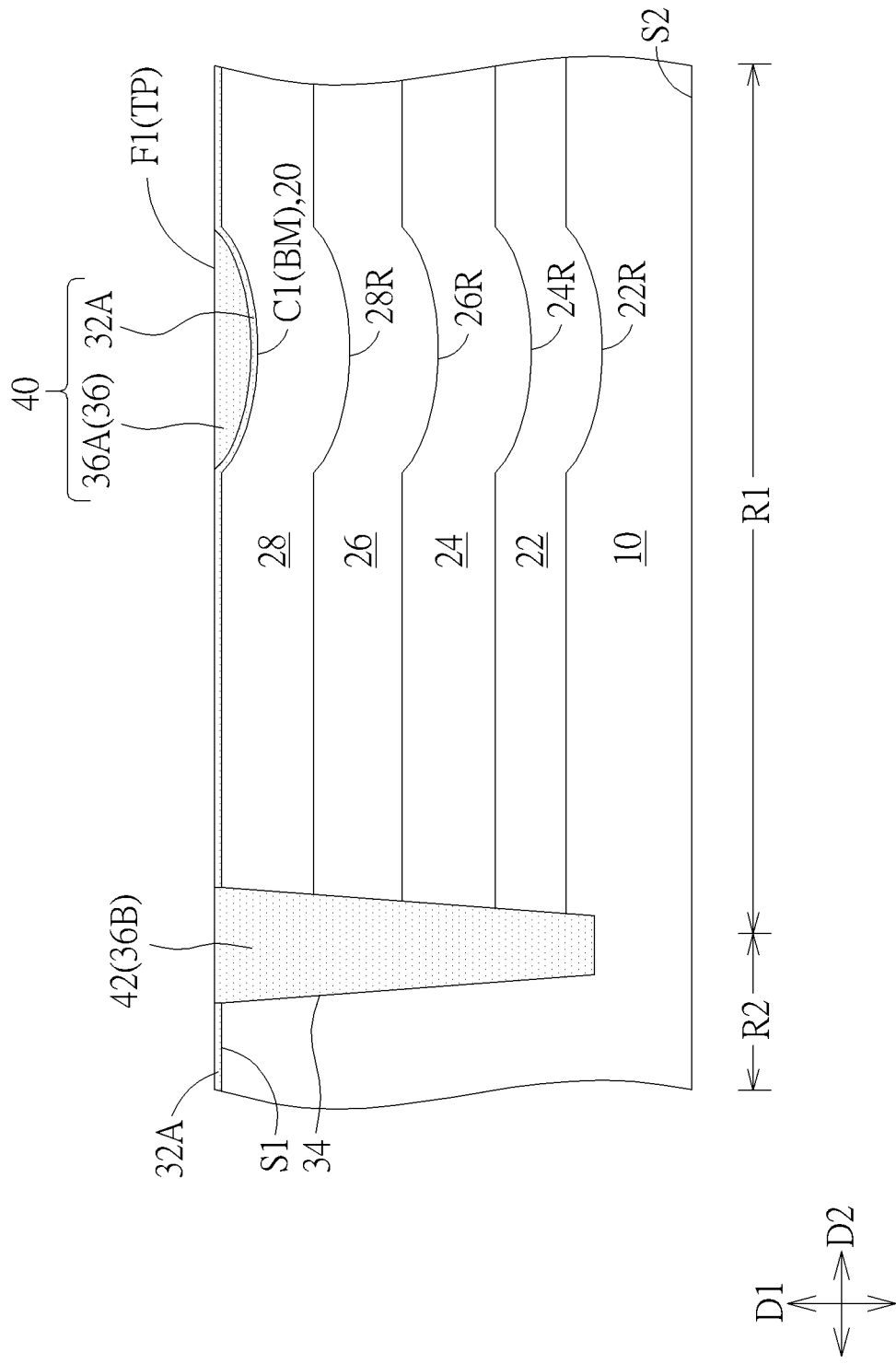
FIG. 13 is a schematic drawing illustrating a high voltage semiconductor device according to a fourth embodiment of the present invention.

Please refer to FIG. 13. FIG. 13 is a schematic drawing illustrating a high voltage semiconductor device 104 according to a fourth embodiment of the present invention. As shown in FIG. 13, in some embodiments, the depth of the trench 34 may be modified according to some design considerations, and the bottommost part of the trench isolation structure 42 may be lower than at least a part of the third well region 22 in the first direction D1 for providing demanded isolation effect. It is worth noting that the design of the trench isolation structure 42 in this embodiment may also be applied in other embodiments of the present invention according to some design considerations.

To summarize the above descriptions, in the high voltage semiconductor device and the manufacturing method thereof according to the present invention, the electrical performance of the high voltage semiconductor device may be improved by the isolation structure with the top including the flat surface and the bottom including the curved surface. For example, the ratio of the drain-source on-state resistance to the breakdown voltage ($R_{on}/V_{BD}$) of the high voltage semiconductor device may be lowered accordingly. In addition, the negative influence of the isolation structure on manufacturing processes of other parts may be reduced by the disposition of the isolation structure with the top including the flat surface, and that will be beneficial for process integration and/or process simplification.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A high voltage semiconductor device, comprising:
   a semiconductor substrate;
   a gate structure disposed on the semiconductor substrate;
   a drift region disposed in the semiconductor substrate and partially disposed at a side of the gate structure;
   a drain region disposed in the drift region;
   an isolation structure at least partially disposed in the drift region, wherein a part of the isolation structure is disposed between the drain region and the gate structure, a top of the isolation structure comprises a flat surface, and a bottom of the isolation structure comprises a curved surface, wherein the drift region comprises a first curved bottom disposed corresponding to the isolation structure in a vertical direction; and
   a first well region disposed in the semiconductor substrate, wherein at least a part of the first well region is disposed under the drift region, and the first well region comprises a second curved bottom disposed corresponding to the first curved bottom of the drift region and the isolation structure in the vertical direction.

2. The high voltage semiconductor device according to claim 1,
   wherein a width of the isolation structure in a horizontal direction is greater than a thickness of the isolation structure in a vertical direction.

3. The high voltage semiconductor device according to claim 1,
   wherein the curved surface of the bottom of the isolation structure protrudes towards a bottom surface of the semiconductor substrate.

4. The high voltage semiconductor device according to claim 1,
   wherein the isolation structure comprises a notch disposed at an edge of the top of the isolation structure.

5. The high voltage semiconductor device according to claim 1,
   wherein the bottom of the isolation structure further comprises a flat surface connected with the curved surface.

6. The high voltage semiconductor device according to claim 1, further comprising:
a second well region disposed in the semiconductor substrate and disposed under the first well region, wherein a conductivity type of the second well region is complementary to a conductivity type of the first well region, and the second well region comprises a third curved bottom disposed corresponding to the second curved bottom of the first well region, the first curved bottom of the drift region, and the isolation structure in the vertical direction.

7. The high voltage semiconductor device according to claim 6,
further comprising:
a third well region disposed in the semiconductor substrate and disposed under the second well region, wherein a conductivity type of the third well region is complementary to the conductivity type of the second well region, and the third well region comprises a fourth curved bottom disposed corresponding to the third curved bottom of the second well region, the second curved bottom of the first well region, the first curved bottom of the drift region, and the isolation structure in the vertical direction.

8. The high voltage semiconductor device according to claim 1,
further comprising:
a trench isolation structure at least partially disposed in the semiconductor substrate, wherein a ratio of a thickness of the trench isolation structure in a vertical direction to a width of the trench isolation structure in a horizontal direction is greater than a ratio of a thickness of the isolation structure in the vertical direction to a width of the isolation structure in the horizontal direction.

9. A manufacturing method of a high voltage semiconductor device, comprising:
providing a semiconductor substrate;
forming a drift region in the semiconductor substrate;
forming an isolation structure, wherein the isolation structure is at least partially disposed in the drift region, a top of the isolation structure comprises a flat surface, and a bottom of the isolation structure comprises a curved surface;
forming a gate structure on the semiconductor substrate, wherein the drift region is partially disposed at a side of the gate structure;
forming a drain region in the drift region, wherein a part of the isolation structure is disposed between the drain region and the gate structure, and the drift region comprises a first curved bottom located corresponding to the isolation structure in a vertical direction; and
forming a well region in the semiconductor substrate, wherein at least a part of the well region is disposed under the drift region, and the well region comprises a second curved bottom disposed corresponding to the first curved bottom of the drift region and the isolation structure in the vertical direction.

10. The manufacturing method of the high voltage semiconductor device according to claim 9, wherein the isolation structure is at least partially formed within a recess in the semiconductor substrate, and the recess is formed before the step of forming the drift region.

11. The manufacturing method of the high voltage semiconductor device according to claim 10, wherein a method of forming the recess comprises:
forming a patterned mask layer on the semiconductor substrate, wherein the patterned mask layer comprises an opening exposing the semiconductor substrate partially;
performing an oxidation process, wherein a part of the semiconductor substrate exposed by the opening is oxidized to be an oxide layer by the oxidation process; and
removing the oxide layer and the patterned mask layer.

12. The manufacturing method of the high voltage semiconductor device according to claim 10, further comprising:
forming a trench in the semiconductor substrate; and
forming a trench isolation structure, wherein the trench isolation structure is at least partially formed in the trench, and the trench is formed after the step of forming the drift region.

13. The manufacturing method of the high voltage semiconductor device according to claim 12, wherein the trench isolation structure and the isolation structure are formed concurrently.

14. The manufacturing method of the high voltage semiconductor device according to claim 13, wherein a ratio of a thickness of the trench isolation structure in a vertical direction to a width of the trench isolation structure in a horizontal direction is greater than a ratio of a thickness of the isolation structure in the vertical direction to a width of the isolation structure in the horizontal direction.

15. The manufacturing method of the high voltage semiconductor device according to claim 9, wherein a width of the isolation structure in a horizontal direction is greater than a thickness of the isolation structure in a vertical direction.

16. The manufacturing method of the high voltage semiconductor device according to claim 9, wherein the isolation structure comprises a notch disposed at an edge of the top of the isolation structure.

* * * * *